(12) United States Patent
Barth

(10) Patent No.: US 6,285,196 B1
(45) Date of Patent: Sep. 4, 2001

(54) PROCESS FOR THE ELECTRICAL TESTING OF THE BASE MATERIAL FOR THE MANUFACTURE OF PRINTED CIRCUIT BOARDS

(75) Inventor: Hermann Barth, Deufringen (DE)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/388,763

(22) Filed: Sep. 2, 1999

(30) Foreign Application Priority Data

Sep. 3, 1998 (DE) ............................................. 198 40 167

(51) Int. Cl.$^7$ ................................................. G01R 31/12
(52) U.S. Cl. ........................... 324/554; 324/551; 324/548
(58) Field of Search ..................................... 324/554, 551, 324/552, 548, 452, 456

(56) References Cited

U.S. PATENT DOCUMENTS

| | | | |
|---|---|---|---|
| 4,504,782 | * | 3/1985 | Zbinden ............................. 324/551 |
| 4,567,428 | * | 1/1986 | Zbinden ........................... 324/554 X |
| 4,648,298 | * | 3/1987 | Sutton ...................................... 83/62 |
| 4,725,314 | * | 2/1988 | Gulla et al. .......................... 106/1.11 |
| 5,097,214 | * | 3/1992 | Schinharl ............................. 324/554 |
| 5,441,474 | * | 8/1995 | Morofuji ................................ 483/55 |
| 5,594,349 | * | 1/1997 | Kimura ................................ 324/551 |
| 5,793,212 | * | 8/1998 | Om ....................................... 324/537 |

* cited by examiner

Primary Examiner—Safet Metjahic
Assistant Examiner—T.R. Sundaram

(57) ABSTRACT

For the electrical testing of base material for manufacturing printed circuit boards, firstly smooth edges to the copper layers of the base material, free of deformation, are produced, preferably in a milling process, which base material is subsequently subjected to testing for a sufficiently high level of electrical resistance between the two copper layers. Successful resistance testing is followed by testing for the dielectric strength of the insulating layer of the base material by measuring the current conduction produced as a result of a disruptive breakdown. This process serves to reduce the amount of processed base material which is rejected, on which, at the present state of the art, there is no electrical testing prior to processing.

12 Claims, 4 Drawing Sheets

PROCESS FOR THE ELECTRICAL TESTING OF THE BASE MATERIAL FOR THE MANUFACTURE OF PRINTED CIRCUIT BOARDS

FIELD OF THE INVENTION

This invention relates to the use of a so-called base material in the manufacture of printed circuit boards for electronic or electric circuits.

BACKGROUND OF THE INVENTION

As the diagram in FIG. 2 shows, this base material consists of two relatively thin copper layers (about 17.5 to 34 micrometers thick), 1 and 2, separated from one another by a layer of fibre-glass resin web, 3, (about 50 to 100 micrometers thick). A layer 0 of base material of this type is the basic material for the manufacture of multi-layer circuit boards. The state of the art for the manufacture of base material and multi-layer circuit boards is described in the book "Handbook of circuit board technology" by Günther Hermann, published by Eugen G. Leuze, D-7968 SAUL-GAU. (References to this publication in what follows will be indicated by "(Handbook, page xx)" in brackets).

In multi-layer circuit boards (or PCB—printed circuit boards) with up to 20 copper layers, several layers, 4, 5, 6, of the base material are placed on top of each other—as shown in the diagram at FIG. 3—after each base material layer has been processed. (Handbook, page 217).

By the processing of a base material layer is meant the creation of printed conductor paths by exposure and etching processes applied to the copper layers. Generally a copper layer with various circuit sections is used as the signal level and the others as reference potential levels.

The base material layers 4, 5 and 6 are separated from one another by intermediate insulating layers $\frac{4}{5}$ and $\frac{5}{6}$, generally made of a fibre-glass epoxy resin compound. These intermediate insulating layers are preferably only 100 micrometers thick. When multi-layer circuit boards are manufactured, the base material layers are pressed together with the intermediate insulating layers under pressure, in a vacuum and at high temperature. That prevents the inclusion of any unwanted air and the epoxy resin in the intermediate insulating layers becomes hard.

When all the layers of base material in the multi-layer circuit boards have been pressed, blind holes and through holes are drilled and metallised at pre-determined places, through which particular points on different copper layers are electrically connected (Handbook, page 423).

Before the manufacture of multi-layer circuit boards, according to the state of the art (in a recommendation by the IPC "Institute of Printed Circuits", USA), certain processed base material layers are subjected to a test of their dielectric strength by applying e.g. 500 V direct current. This results in a relatively high rate of rejection, especially in the case of very thin layers of fibre-glass resin web.

Circuit boards with high specifications, e.g. for fast computers, must have particularly thin fibreglass resin layers, because it is in this way that the required higher capacity is achieved.

The processed base material which is rejected in the high voltage test according to the state of the art is the result of 1. flaws in the fibre-glass resin web of the base material or
2. conductive impurities (e.g. conductive metal particles in the surrounding area) on or in this layer.

According to the state of the art the rejected material is only identified when the base material layer has already been processed (Handbook, pages 221/222), i.e. after the processes-expensive in terms of both time and money-to manufacture the printed circuit from the corresponding copper layers have already been completed.

Base material which has been processed and is then rejected in the high-voltage test represents not only a waste of materials but also unnecessary processing.

According to the state of the art there is no preliminary electrical testing of unprocessed base material.

SUMMARY OF THE INVENTION

To overcome the above-indicated disadvantage, it is the aim of the invention to develop a process for the preliminary testing of base material layers which would allow these layers to be tested for their electrical usability before they are processed.

This aim of the invention will be achieved by the characteristics described in claim 1.

Advantageous further developments of the process according to the invention are described in the sub-claims.

BRIEF DESCRIPTION OF THE DRAWINGS

The invention is presented with diagrams and described in more detail below. The diagrams are as follows.

DETAILED DESCRIPTION OF THE PREFERRED EMBODIMENT

The process according to the invention comprises steps 1 and 2 or steps 1, 2 and 3 as described below:

1. Processing the layers of base material to produce smooth edges to the copper layers of the base material, free from deformation.
2. Testing the electrical resistance between the copper layers of the base material layers, and excluding those layers with too low a level of resistance.
3. High-voltage testing of the base material layers, and excluding those layers in which disruptive breakdown occurred during the test.

In the first step of the process 1 (Block A in FIG. 1), the base material is processed at the edges in a particular way so that the so-called ductility of the copper material has no effect there.

When the base material is being cut to its pre-determined format dimensions (e.g. 623×468 mm), previously according to the state of the art it was cut out with guillotine shears.

Figure 4A:
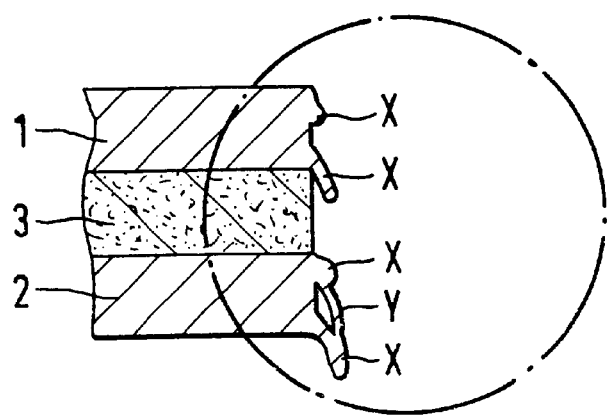
FIG. 4A: a cross-section of a piece of base material with deformed edges to the copper layers due to cutting out with guillotine shears (Handbook, pages 73–74)

The shearing process resulted in the copper layer becoming deformed at the edges. FIG. 4A is a diagram of a cross-section showing the deformation of the copper layers at their edges as a result of the shearing process.

Figure 2:
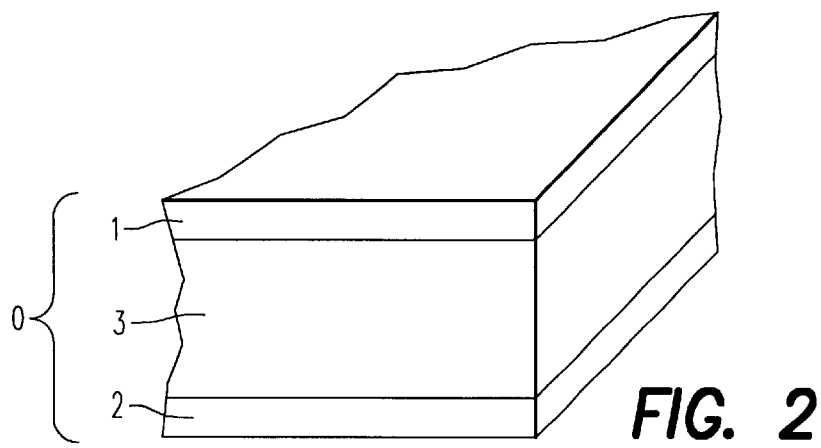
FIG. 2: a diagram of a cross-section of part of a base material layer.
Figure 3:
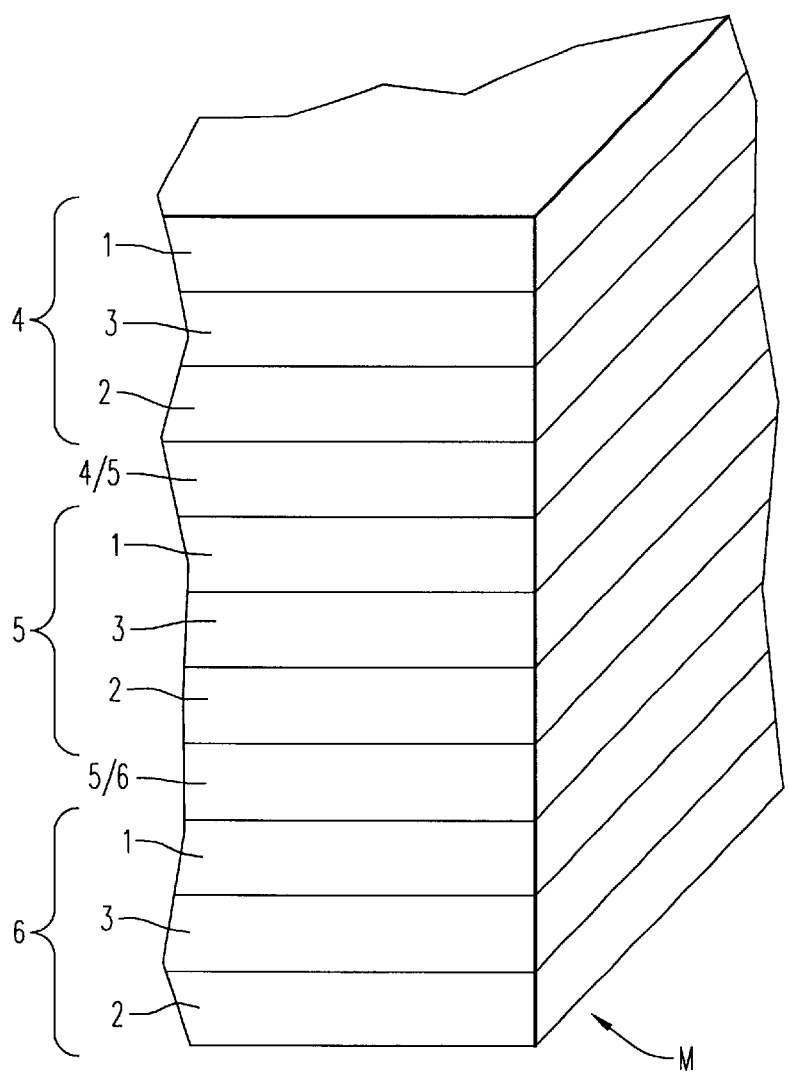
FIG. 3: a diagram of a cross-section of part of a multi-layer circuit board.

In FIG. 4A and FIG. 2 the copper layers are marked as 1 and 2. The shearing process does not produce the required smooth edges at the cut edges of the copper layers 1 and 2 (as shown in the enlarged section in FIG. 4B), but a "warped" edge, with the copper on the surface becoming raggedly deformed in a bulge. This deformation is a result of the ductility of the copper (ductile=workable; ductility= ability to be worked, especially referring to metal substances).

Figure 4B:
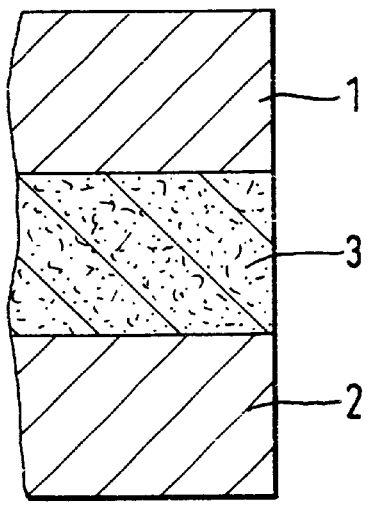
FIG. 4B: a cross-section of a piece of base material with perfectly smooth cut edges to the copper layers, free of deformation.
Figure 4C:
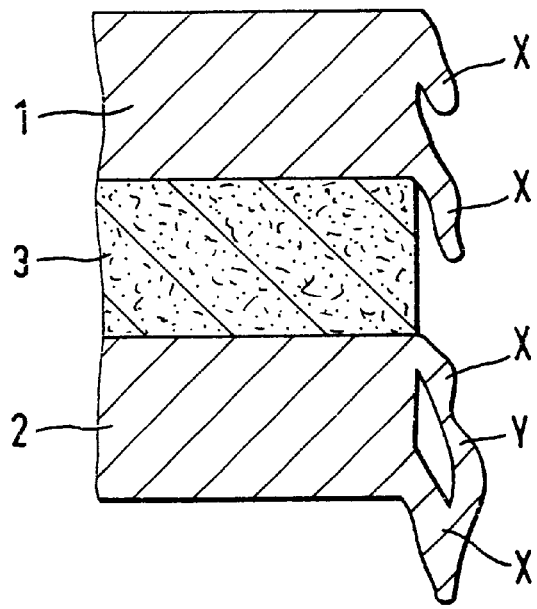
FIG. 4C: an enlarged cross-section of the piece of base material shown in FIG. 4A.

FIG. 4C is an enlarged cross-section showing the deformation of the copper layers of the base material at the cut edges as a result of cutting out with guillotine shears. The copper layers are marked as 1 and 2 in FIG. 4C as in FIGS. 2, 4A and 4B. The fibre-glass resin web layer is marked as 3 in FIGS. 4A, 4B and 4C. The bulging, ragged deformation X occurs particularly at the upper and lower edges of the copper layers. In addition, ridges or bridges Y can also form between the bulges X.

These ragged, bulging deformations which occur according to the state of the art have the following disadvantages:

They form electrical short circuits between the copper layers 1 and 2.

Figure 5:
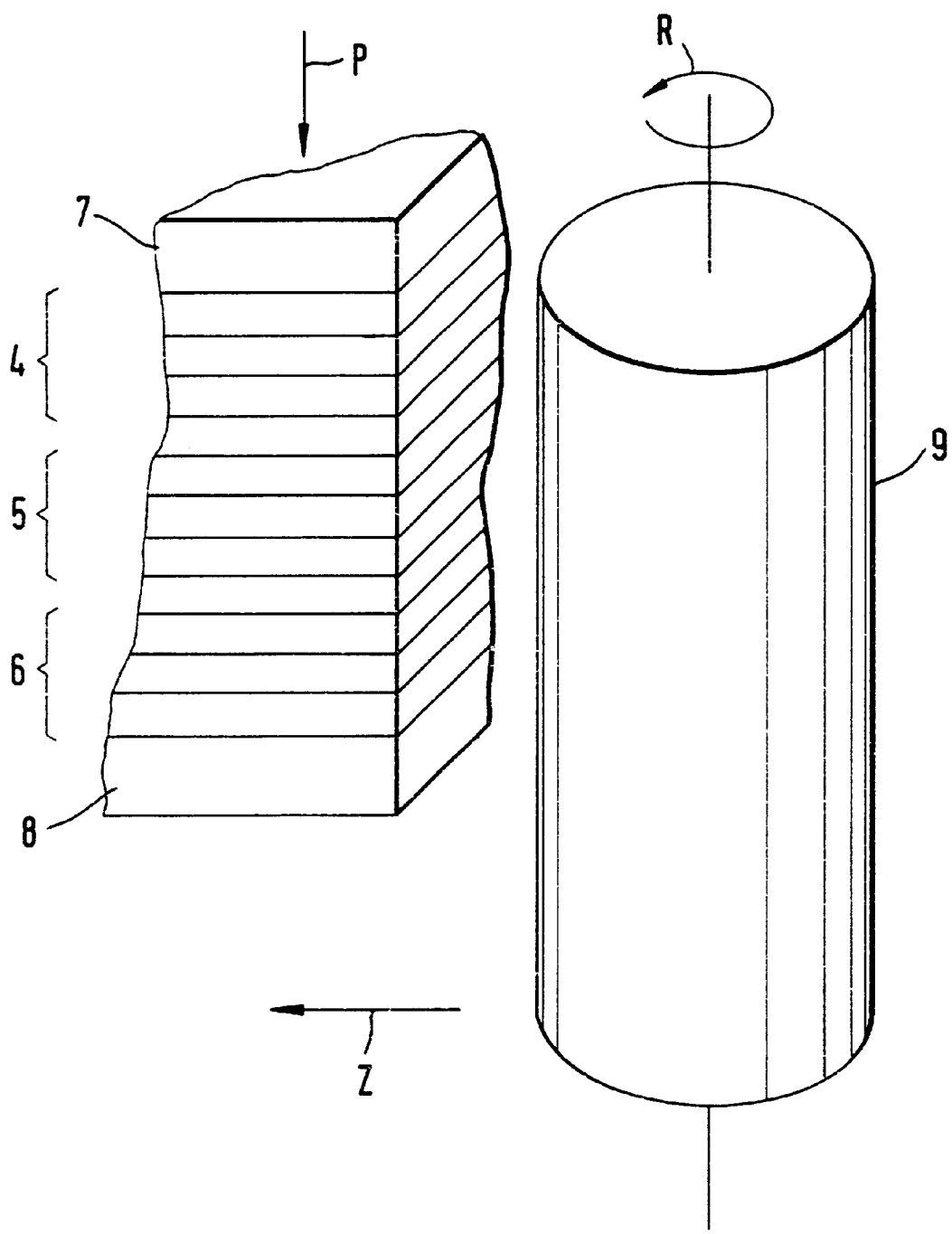
FIG. 5: a diagram showing a milling process to produce smooth edges to the copper layers of the base material, free of deformation.

According to the invention, the occurrence of deformations at the edges of the copper layers in the base material layers due to ductility is eliminated by a milling process, as shown in FIG. 5.

A large number (e.g. 100) base material layers are pressed together on top of each other between an upper and lower covering plate (made for example of 4 mm thick aluminium), in the direction of the arrow P; that also prevents the base material layers 4, 5, 6 from shifting sideways.

The milling head 9 rotates in direction R and is moved translationally in direction Z to give all the base material layers 4, 5, 6 (together with the cover plates 7, 8) the required smooth "non-ductile" edge (free of deformation). The smooth edge of the copper layers is as shown in FIG. 4B.

This "smooth" edge is the pre-requisite for the two subsequent measuring processes (Blocks B and C in FIG. 1), involving preliminary testing of the base material for electrical usability, in accordance with the invention. The edges of the copper layers of the base material which are "free of deformation" will be referred to as "smooth" edges below.

It should be emphasised here that smooth edges can also be produced by other methods instead of a milling process, e.g. by sawing or (for individual layers) by water jet cutting.

In the second stage of the process (Block B in FIG. 1), the electrical resistance of a base material layer with smooth edges to the copper layers is tested. This is done by placing the object to be measured between two contacts, preferably contact plates, and measuring the electrical resistance between the two copper layers 1 and 2. The resistance is measured by applying a voltage below the breakdown voltage of the insulating fibre-glass resin layer.

Where the two copper layers 1 and 2 in the base material are not fully or not adequately (e.g. resistance values in the mega-ohm range are considered adequate) electrically insulated from each other, there is a level of electrical resistance, set accordingly below this limit, which would cause base material which is no longer suitable for processing to be rejected.

Normally when measuring electrical resistance the two copper layers 1 and 2 are tested using measuring equipment with an electrical voltage which, in the event of resistance values which are lower than required (a sign of inadequate or failed insulation between the copper layers), produces appropriate current conduction. This current conduction is indicated via an appropriate signal device and is used to reject the defective base material layer.

Those base material layers which have successfully passed the resistance testing stage of the process are subjected in the next stage to testing for dielectric strength.

To do this, the object to be tested, a layer of base material, is again placed between two contacts and tested using measuring equipment with an electric direct current (high voltage, e.g. 500V, depending on the disruptive breakdown specifications of the fibre-glass resin layer 3).

If the object to be tested shows flaws in layer 3 or conductive particles on or in this layer, the high voltage which is applied leads to a disruptive breakdown, as a result of which there is current conduction between the copper layers. The level of the current can be limited by a resistor. The occurrence of such a breakdown or the resulting current conduction is detected by the testing equipment (e.g. by a current conduction measuring device, a voltmeter or power indicator) and sends an appropriate signal to result in the refection of the defective base material.

Other possible methods of measuring disruptive breakdown are also acceptable.

The key to the process according to the invention for preliminary electrical testing of the base material for printed circuit boards lies in producing smooth edges to the copper layers and testing the resistance of the base material. It has been shown that up to 70% of all the defective layers of base material are detected by resistance testing. The remainder is detected in the subsequent breakdown testing.

Figure 1:
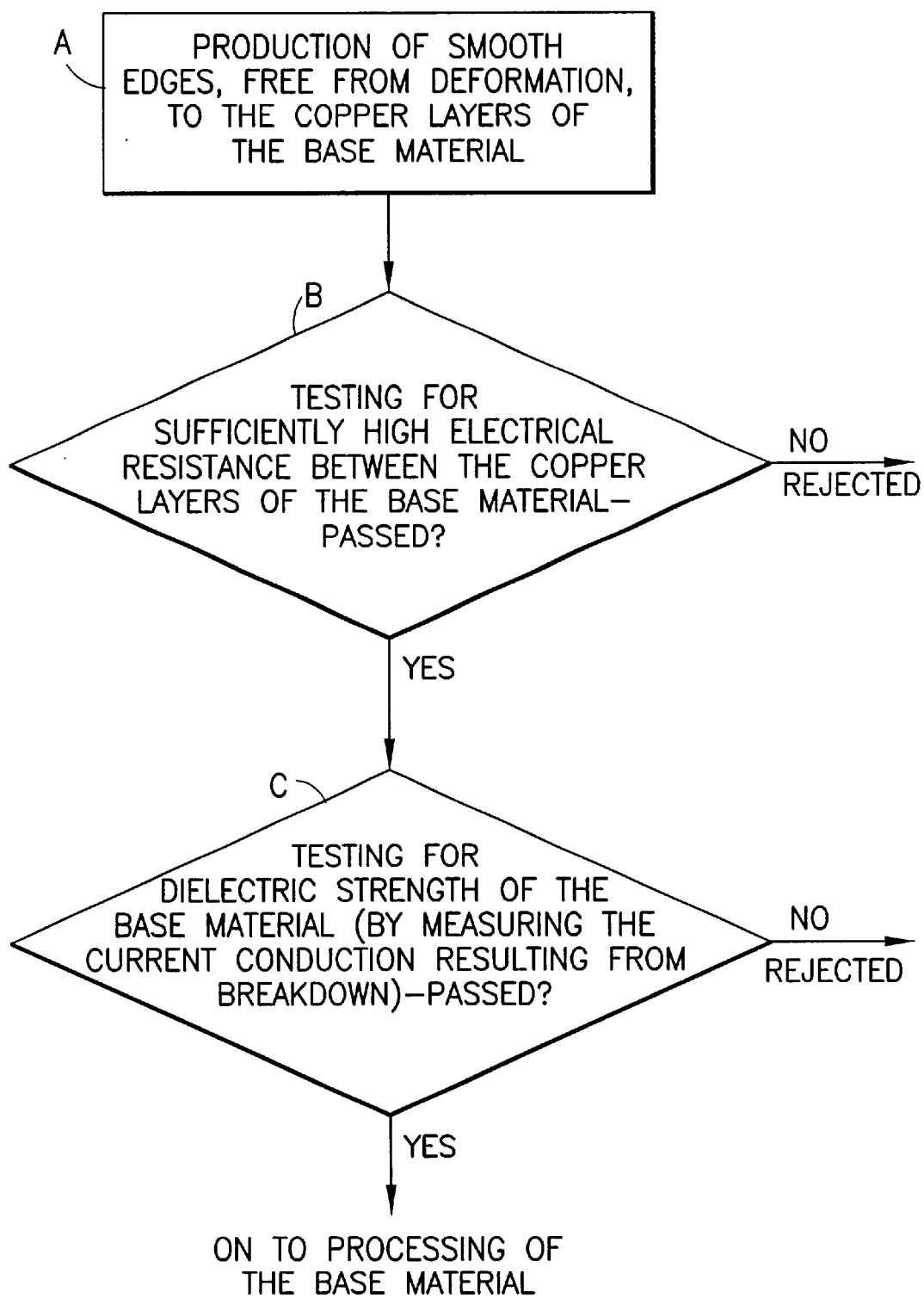
FIG. 1: a block diagram showing the sequence of processes according to the invention.

FIG. 1 shows as a block diagram the sequence of processes in the procedure according to the invention. Block A shows the stage where the base material is processed to produce smooth edges, free of deformation. Block A is followed by the resistance testing of the base material for a sufficiently high level of resistance to ensure insulation between the copper layers of the base material. Where the resistance is too low the base material layer in question is identified as a reject; where resistance is sufficiently high there follows in Block C, the high voltage testing of the base material layer for dielectric strength. Where disruptive breakdown, or a current conduction resulting from a breakdown (forming breakdown contact), occurs, the base material layer is identified as a reject; otherwise the base material has passed the testing for electrical usability and can be subjected to subsequent processing to produce the printed circuit.

It must be clearly stated that the processes according to the invention can be carried out automatically, i.e. with no subjective evaluation by people operating the processing and measuring equipment.

The resistance testing and the high-voltage test can take place one after the other at the same test bench. The individual layers of base material are also put in position and dispatched automatically, controlled by appropriate signals, e.g. by controlled suction cup hydraulics (automatic stacking device from Kuttler Handhabungstechnik GmbH, D7735 Dauchingen).

The test results for one base material layer can also be used to make conclusions about the electrical behaviour of the multi-layer circuit board, if the material used for the fibre-glass resin layer 3 in the base material and the intermediate insulating layers of the multi-layer circuit board is identical in thickness, composition and structure.

What is claimed is:

1. A process for electrical testing of a base material for manufacture of a printed circuit board, the process comprising the steps of:
   providing the base material, the base material having electrically conductive layers arranged on both sides of an insulating layer;
   reducing deformations at edges of one or more of the conductive layers to reduce potential short circuits between the conductive layers;
   measuring electrical resistance between the two conductive layers by applying a test voltage thereto; and
   rejecting the base material if the resistance is less than a predetermined value.

2. A process according to claim 1, comprising the additional step of subsequently testing dielectric strength of the insulating layer by measuring current conduction produced as a result of a disruptive breakdown of the insulating layer.

3. A process according to claim 1, wherein the step of removing deformations is achieved by a milling or sawing process.

4. A process according to claim 2, wherein the step of testing dielectric strength of the insulating layer is achieved with a direct voltage.

5. A process according to claim 1, wherein identical material of the same dielectric strength is used for the insulating layer of the base material and insulating intermediate layers of a multi-layer circuit board.

6. A process for producing a printed circuit board from a base material having at least two electrically conductive layers spaced apart by an insulating layer, the process comprising the steps of:
   a) reducing deformations at edges of one or more of the conductive layers to reduce potential short circuits between the conductive layers;
   b) testing the integrity of the insulating layer; and subsequent to step b),
   c) configuring the circuit board to create at least one conductive path through the insulating layer, and thereby connect one conductive layer to another.

7. A process according to claim 6, wherein the testing includes the step of measuring resistance of the insulating layer by applying a test DC voltage across the insulating layer, the test voltage being smaller than the breakdown voltage of the insulating layer.

8. A process according to claim 6, wherein the step of testing includes testing dielectric strength of the insulating layer.

9. A process according to claim 6, wherein the step of reducing deformations is performed by a machining process.

10. A process according to claim 9, wherein the machining process is selected from the group consisting of milling and sawing.

11. A process according to claim 9, wherein the machining process is water jet cutting.

12. A process according to claim 6, wherein the step of configuring the circuit board includes the step of drilling one or more holes through the insulating layer.

* * * * *